United States Patent
Lin et al.

(10) Patent No.: US 9,455,747 B1
(45) Date of Patent: Sep. 27, 2016

(54) PARALLEL CHIEN SEARCH WITH FOLDING AND A SYMBOLIZED MINIMAL POLYNOMIAL COMBINATIONAL NETWORK (S-MPCN)

(71) Applicant: SK Hynix Inc., Gyeonggi-do (KR)

(72) Inventors: Yi-Min Lin, San Jose, CA (US);
Abhiram Prabhakar, Fremont, CA (US); Lingqi Zeng, San Jose, CA (US); Jason Bellorado, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 103 days.

(21) Appl. No.: 14/223,643

(22) Filed: Mar. 24, 2014

Related U.S. Application Data

(60) Provisional application No. 61/805,765, filed on Mar. 27, 2013.

(51) Int. Cl.
*H03M 13/00* (2006.01)
*H03M 13/15* (2006.01)

(52) U.S. Cl.
CPC ....... *H03M 13/1575* (2013.01); *H03M 13/152* (2013.01); *H03M 13/616* (2013.01)

(58) Field of Classification Search
CPC ......... H03M 13/1575; H03M 13/152; H03M 13/616
See application file for complete search history.

(56) References Cited

U.S. PATENT DOCUMENTS

| | | | |
|---|---|---|---|
| 2004/0010742 A1* | 1/2004 | Williamson et al. | 714/746 |
| 2005/0172208 A1* | 8/2005 | Yoon | 714/784 |
| 2008/0215956 A1* | 9/2008 | Williamson et al. | 714/785 |
| 2009/0259921 A1* | 10/2009 | Chang et al. | 714/782 |
| 2010/0131831 A1* | 5/2010 | Weingarten et al. | 714/782 |
| 2010/0199156 A1* | 8/2010 | Yang | 714/785 |
| 2011/0239091 A1* | 9/2011 | Toda | 714/767 |
| 2011/0296281 A1 | 12/2011 | Lin et al. | |
| 2014/0068392 A1* | 3/2014 | Kokubun et al. | 714/785 |

OTHER PUBLICATIONS

Song et al., "10- and 40-Gb/s Forward Error Correction Devices for Optical Communications", IEEE Journal of Solid-State Circuits, vol. 37, No. 11, Nov. 2002.
Yang et al., "An Area-Efficient BCH Codec with Echelon Scheduling for NAND Flash Applications", IEEE ICC, 2013.
Chang et al., "A Low-Power Reed-Solomon Decoder for STM-16 Optical Communications", 2002.
Lin et al., "A MPCN-Based Parallel Architecture in BCH Decoders for NAND Flash Memory Devices", IEEE Transactions on Circuits and Systems—II: Express Briefs, vol. 58, No. 10, Oct. 2011.
Chen et al., "Small Area Parallel Chien Search Architectures for Long BCH Codes", IEEE Transactions on Very Large Scale Integration(VLSI) Systems, vol. 12, No. 5, May 2004.
Cho et al., "Strength-Reduced Parallel Chien Search Architecture for Strong BCH Codes", IEEE Transactions on Circuits and Systems—II: Express Briefs, vol. 55, No. 5, May 2008.

\* cited by examiner

*Primary Examiner* — Bryce Bonzo
*Assistant Examiner* — Thien D Nguyen
(74) *Attorney, Agent, or Firm* — IP & T Group LLP

(57) ABSTRACT

A hinge path is used to determine if a first possible root is a root of an error location polynomial. A positive limb path is used to determine if a second possible root is a root of the error location polynomial, including by using a sequence of coefficients associated with the error location polynomial. The sequence of coefficients is reversed and a negative limb path is used to determine if a third possible root is a root of the error location polynomial, including by using the reversed sequence of coefficients, wherein the negative limb path is a copy of the positive limb path.

15 Claims, 12 Drawing Sheets

$$\Lambda(\alpha^i) = M_i(x) \times Q_i(x) + B_i(x)\big|_{x=\alpha^i} + 1 = B_i(\alpha^i) + 1$$

$$= \underbrace{\sum_{j=1}^{t}(\Lambda_j \alpha^j_{m-1,(i)} x^{m-1} + \cdots + \Lambda_j \alpha^j_{1,(i)} x + \Lambda_j \alpha^j_{0,(i)})\big|_{x=\alpha^i}}_{\text{S-MPCN i}} + \underbrace{1}_{\text{S-BT i}}$$

⟵ 400

$$\Lambda(\alpha^{2i}) = B_{2i}(\alpha^{2i}) + 1$$

$$= \sum_{j=1}^{t} \Lambda_j (x^j \bmod M_{2i}(x))\big|_{x=\alpha^{2i}} + 1 = \sum_{j=1}^{t} \Lambda_j (x^j \bmod M_i(x))\big|_{x=\alpha^{2i}} + 1$$

$$= \underbrace{\sum_{j=1}^{t}(\Lambda_j \alpha^j_{m-1,(i)} x^{m-1} + \cdots + \Lambda_j \alpha^j_{1,(i)} x + \Lambda_j \alpha^j_{0,(i)})\big|_{x=\alpha^{2i}}}_{\text{S-MPCN i}} + \underbrace{1}_{\text{S-BT 2i}} = B_i(\alpha^{2i}) + 1$$

⟵ 410

S-MPCN = Symbolized Minimal Polynomial Combinational Network
S-BT = Symbolized Basis Transformer

⟵ 420

|       | $\alpha^i$ | $\alpha^{2i}$ | $\alpha^{4i}$ | $\alpha^{8i}$ | ... |
|-------|------------|---------------|---------------|---------------|-----|
| $i=1$ | $\alpha^1$ | $\alpha^2$    | $\alpha^4$    | $\alpha^8$    | ... |
| $i=3$ | $\alpha^3$ | $\alpha^6$    | $\alpha^{12}$ | $\alpha^{24}$ | ... |
| $i=5$ | $\alpha^5$ | $\alpha^{10}$ | $\alpha^{20}$ | $\alpha^{40}$ | ... |
| $i=7$ | $\alpha^7$ | $\alpha^{14}$ | $\alpha^{28}$ | $\alpha^{56}$ | ... |
| ⋮     | ⋮          | ⋮             | ⋮             | ⋮             |     |

FIG. 4

S-MPCN = Symbolized Minimal Polynomial
Combinational Network
S-BT = Symbolized Basis Transformer

←— 700

|   | $\alpha^i$ | $\alpha^{2i}$ | $\alpha^{4i}$ | $\alpha^{8i}$ | $\alpha^{16i}$ | $\alpha^{32i}$ |
|---|---|---|---|---|---|---|
| $i = 1$ | $\alpha^1$ | $\alpha^2$ | $\alpha^4$ | $\alpha^8$ | $\alpha^{16}$ | $\alpha^{32}$ |
| $i = 3$ | $\alpha^3$ | $\alpha^6$ | $\alpha^{12}$ | $\alpha^{24}$ | - | - |
| $i = 5$ | $\alpha^5$ | $\alpha^{10}$ | $\alpha^{20}$ | - | - | - |
| $i = 7$ | $\alpha^7$ | $\alpha^{14}$ | $\alpha^{28}$ | - | - | - |
| $i = 9$ | $\alpha^9$ | $\alpha^{18}$ | - | - | - | - |
| $i = 11$ | $\alpha^{11}$ | $\alpha^{22}$ | - | - | - | - |
| $i = 13$ | $\alpha^{13}$ | $\alpha^{26}$ | - | - | - | - |
| $i = 15$ | $\alpha^{15}$ | $\alpha^{30}$ | - | - | - | - |
| $i = 17$ | $\alpha^{17}$ | - | - | - | - | - |
| $i = 19$ | $\alpha^{19}$ | - | - | - | - | - |
| $i = 21$ | $\alpha^{21}$ | - | - | - | - | - |
| $i = 23$ | $\alpha^{23}$ | - | - | - | - | - |
| $i = 25$ | $\alpha^{25}$ | - | - | - | - | - |
| $i = 27$ | $\alpha^{27}$ | - | - | - | - | - |
| $i = 29$ | $\alpha^{29}$ | - | - | - | - | - |
| $i = 31$ | $\alpha^{31}$ | - | - | - | - | - |

Cost of S-MPCN Block Increases as the Magnitude of i Increases

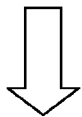

FIG. 7

PARALLEL CHIEN SEARCH WITH FOLDING AND A SYMBOLIZED MINIMAL POLYNOMIAL COMBINATIONAL NETWORK (S-MPCN)

CROSS REFERENCE TO OTHER APPLICATIONS

This application claims priority to U.S. Provisional Patent Application No. 61/805,765 entitled AREA-EFFICIENT PARALLEL CHIEN SEARCH FOR STRONG BCH DECODERS filed Mar. 27, 2013 which is incorporated herein by reference for all purposes.

BACKGROUND OF THE INVENTION

A Chien search is used in BCH decoding to iteratively examine all possible values (e.g., for a total of N values) to find the roots of an error location polynomial, $\Lambda(x) = \Lambda_r x^r + \ldots + \Lambda_1 x + \Lambda_0$. The roots of the error location polynomial identify locations of errors, for example in data received over a communications channel or read back from storage. In other words, a Chien search essentially finds the locations of errors when given an error location polynomial. To improve the decoding efficiency for long BCH codes, multiple successive locations can be examined using a parallel Chien search. Although a number of parallel Chien search architectures are known, it would be desirable if new parallel Chien search architectures which require less logic could be developed. Less logic corresponds to lower semiconductor costs, smaller semiconductor die sizes (which is attractive for mobile and/or handheld products), and/or reduced power consumption.

BRIEF DESCRIPTION OF THE DRAWINGS

Various embodiments of the invention are disclosed in the following detailed description and the accompanying drawings.

FIG. 4 is a diagram showing an embodiment of a remainder polynomial which is common to two possible roots which are conjugates.

FIG. 7 is a table showing an embodiment of related conjugate roots $\alpha^1 - \alpha^{32}$.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
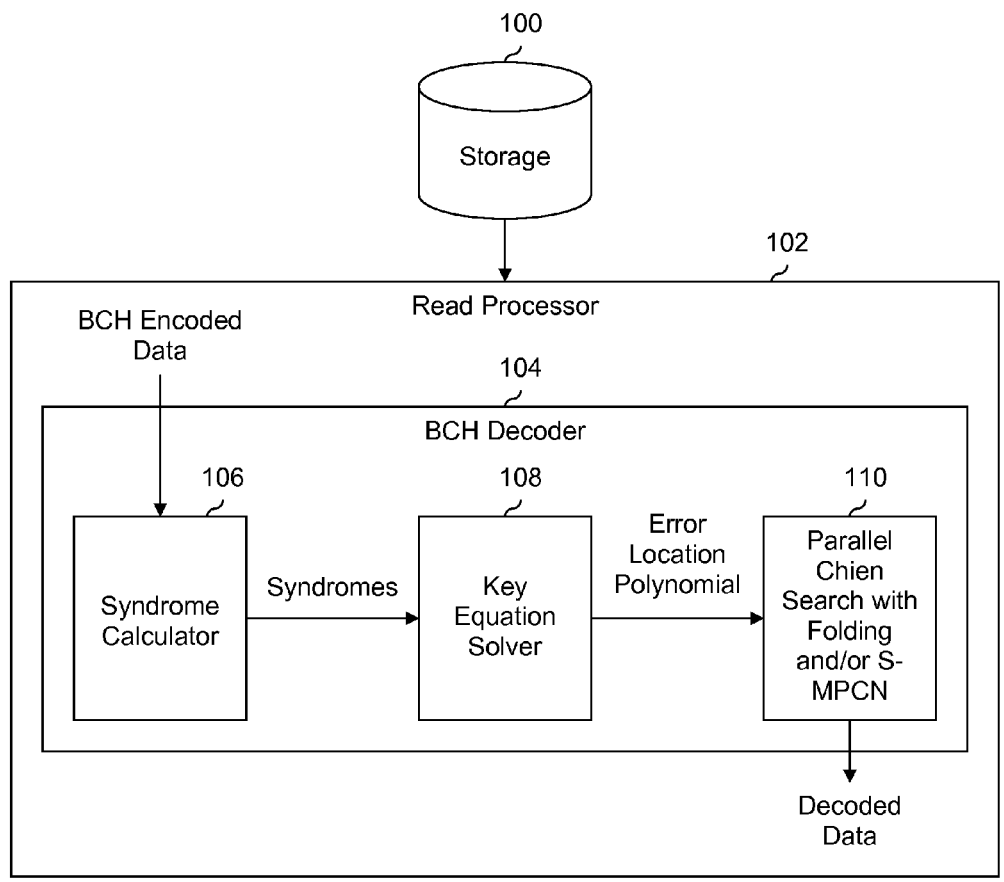
FIG. 1 is a diagram showing an embodiment of a storage system which includes a parallel Chien search block with folding and/or a symbolized minimal polynomial combinational network (S-MPCN).

FIG. 1 is a diagram showing an embodiment of a storage system which includes a parallel Chien search block with folding and/or a symbolized minimal polynomial combinational network (S-MPCN). In this example, data which is stored on storage 100 is error correction encoded using a BCH code. Read processor 102 is responsible for accessing and error correction decoding data which is stored on storage 100. In some embodiments, storage 100 comprises solid state storage, such as NAND Flash. In some embodiments, read processor 102 is implemented on or using a semiconductor device, such as an application-specific integrated circuit (ASIC) or a field-programmable gate array (FPGA). For clarity, elements which are unrelated to the techniques described herein (such as a write processor which corresponds to read processor 102 or a BCH encoder which corresponds to BCH decoder 104) are not shown in this and other figures.

Read processor 102 includes BCH decoder 104 which error correction decodes the BCH encoded data and outputs decoded data (if possible). BCH decoder 104 includes syndrome calculator 106, key equation solver 108, and parallel Chien search block 110. Syndrome calculator 106 calculates one or more syndromes (e.g., in the form of a syndrome polynomial) using the BCH encoded data. The syndromes are passed to key equation solver 108 which generates an error location polynomial from the syndromes.

Parallel Chien search block 110 solves for the roots of the error location polynomial by iteratively examining all potential roots. In other words, all possible values in the Galois Field (GF) are tested. More formally, let $\Lambda(x)=\Lambda_t x^t + \ldots + \Lambda_1 x + \Lambda_0$ be the error location polynomial where $\Lambda_i \in GF(2^m)$. Let $M_i(x)$ be the minimal polynomial of $\alpha^i$ with degree m (at most). Let $\alpha_{(i)}$ be the primitive element if $M_i(x)$ is used to construct $GF(2^m)$, where $\alpha_{(i)} \in GF(2^m)$. Let $\alpha_{k,(i)}{}^j$ be the $k^{th}$ coordinate of $\alpha_{(i)}{}^j$, where $\alpha_{(i)}{}^j \in GF(2^m)$ and $\alpha_{k,(i)}{}^j \in GF(2)$.

An (N, K, t) BCH code has block length of N bits and information length of K bits. While operating under $GF(2^m)$, the code has an error correcting capability of t, where $N-K \leq m^*t$. A Chien search (in general) iteratively examines all possible values (for a total of N values) to find the root(s) of error location polynomial $\Lambda(x)$. A parallel Chien search (in general) examines multiple locations in parallel.

If the number of roots located by parallel Chien search block 110 equals the degree of the error location polynomial, then decoding is successful, the locations of the errors are corrected (e.g., by flipping the bits in those locations), and the decoded data is output by parallel Chien search block 110. If the number of located roots does not equal the degree of the error location polynomial, then the errors contained in the BCH encoded data have exceeded the error correction capability of the BCH code and decoding is unsuccessful.

A variety of parallel Chien search architectures are described herein and any combination of them may be employed by parallel Chien search block 110. First, parallel Chien search with folding is described. Next, S-MPCN is described, which is another type of parallel Chien search. Then, a combination of parallel Chien search with folding and S-MPCN is described. Finally, a combination of parallel Chien search with folding and S-MPCN with further improvements is described.

Parallel Chien Search with Folding

Figure 2:
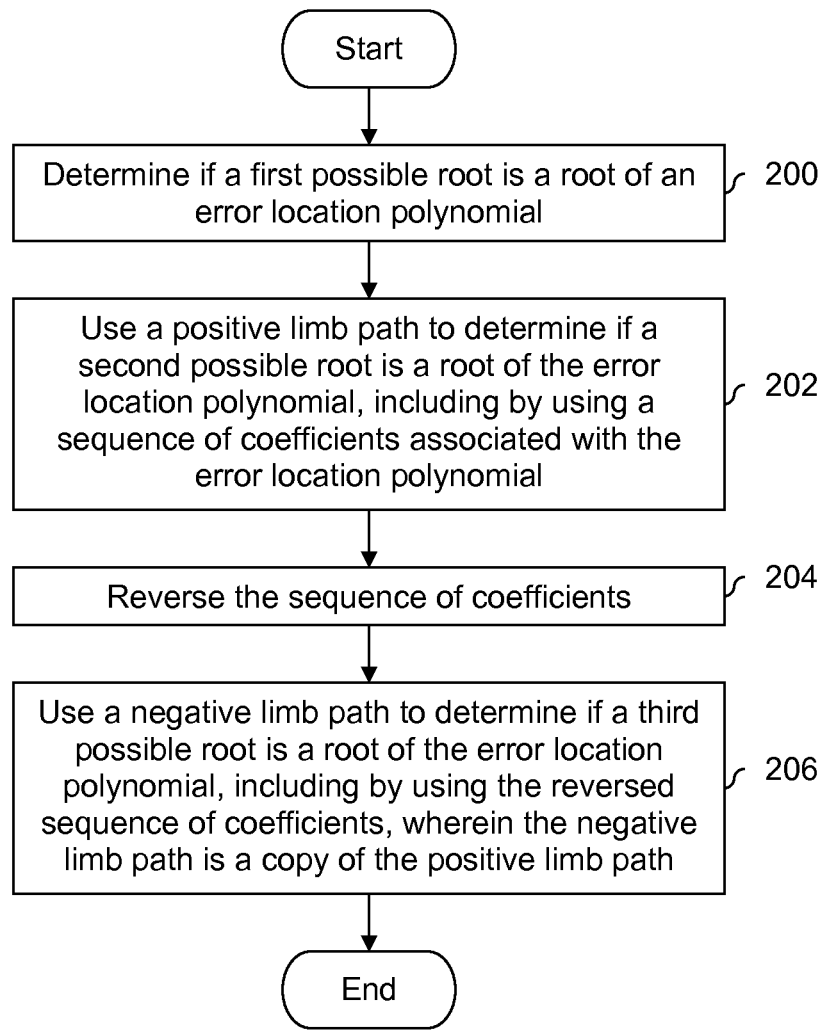
FIG. 2 is a flowchart illustrating an embodiment of a parallel Chien search process with folding.

FIG. 2 is a flowchart illustrating an embodiment of a parallel Chien search process with folding. In some embodiments, parallel Chien search block 110 in FIG. 1 performs the example process shown.

At 200, it is determined if a first possible root is a root of an error location polynomial. In some embodiments, step 200 is performed by a hinge path.

At 202, a positive limb path is used to determine if a second possible root is a root of the error location polynomial, including by using a sequence of coefficients associated with the error location polynomial. For example, the sequence of coefficients may be $(\Lambda_t, \Lambda_{t-1}, \ldots, \Lambda_1, \Lambda_0)$ where the error location polynomial is $\Lambda(x)=\Lambda_t x^t + \ldots + \Lambda_1 x + \Lambda_0$. In various embodiments, the sequence of coefficients is received from the hinge path, or from a key equation solver.

At 204, the sequence of coefficients is reversed. For example, the sequence of coefficients $(\Lambda_t, \Lambda_{t-1}, \ldots, \Lambda_1, \Lambda_0)$ becomes the reversed sequence $(\Lambda_0, \Lambda_1, \ldots, \Lambda_{t-1}, \Lambda_t)$.

At 206, a negative limb path is used to determine if a third possible root is a root of the error location polynomial, including by using the reversed sequence of coefficients, wherein the negative limb path is a copy of the positive limb path. To put it another way, a given negative limb path is a copy of a corresponding positive limb path.

Mathematically, it can be proven that a negative limb path (which is a copy of its corresponding positive limb path) which inputs a reversed sequence of coefficients still properly tests whether a given possible root is a root of the error location polynomial. For example, suppose the error location polynomial has three coefficients: $\Lambda(x)=\Lambda_2 x^2 + \Lambda_1 x + \Lambda_0$. An exemplary positive limb path tests the root $\alpha^1$. This corresponds to checking whether $\Lambda(\alpha^1)=\Lambda_2 \alpha^2 + \Lambda_1 \alpha + \Lambda_0$ equals 0. A corresponding negative limb path checks whether $\Lambda(\alpha^{-1})=\Lambda_2 \alpha^{-2} + \Lambda_1 \alpha^{-1} + \Lambda_0$ equals 0. $\Lambda(\alpha^{-1})$ can be rewritten as $\alpha^{-2}(\Lambda_0 \alpha^2 + \Lambda_1 \alpha^1 + \Lambda_2)$. Note that the coefficients within the summation in $\Lambda(\alpha^{-1})$ are $(\Lambda_0, \Lambda_1, \Lambda_2)$ and the coefficients in $\Lambda(\alpha^1)$ are $(\Lambda_2, \Lambda_1, \Lambda_0)$, which is the same sequence but reversed. Since the test is whether or not the evaluated polynomial is zero or not (so any change in magnitude or sign due to $\alpha^{-2}$ in $\Lambda(\alpha^{-1})$ is moot), this demonstrates that a negative limb path which is a copy of the corresponding positive limb path and which inputs the reversed sequence of coefficients properly tests whether a given possible root is a root of the error location polynomial.

Although a positive limb path could be a copy of the corresponding negative limb path, having a negative limb path be a copy of the corresponding positive limb path is preferable in some applications because a negative limb path costs more than its corresponding positive limb path (e.g., a negative limb path requires more logic than its corresponding positive limb path). In such cases, having the negative limb path be a copy of the corresponding positive limb path reduces the amount of logic used.

The following figures show examples of systems which perform the process of FIG. 2.

Figure 3A:
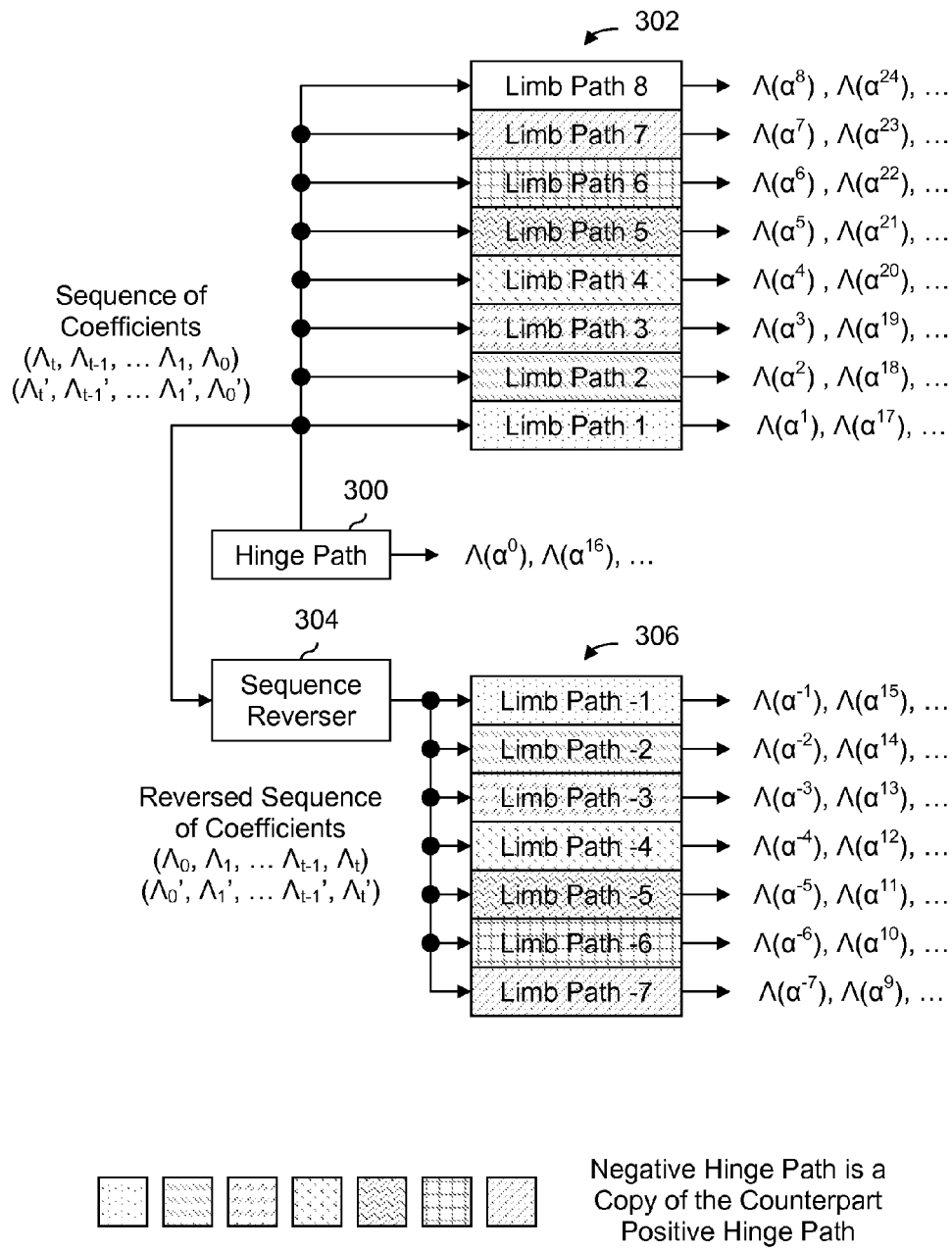
FIG. 3A shows an embodiment of a 16-parallel Chien search block with folding with a single hinge path.

FIG. 3A shows an embodiment of a 16-parallel Chien search block with folding with a single hinge path. In the example shown, 16 possible roots of an error location polynomial are examined in parallel per iteration. Each path in sets 300, 302, and 306 includes logic (not shown) for examining a given possible root of the error location polynomial.

At a first iteration, hinge path 300 examines the $0^{th}$ possible root (e.g., $\alpha^0$ is the $0^{th}$ possible root and $\Lambda(\alpha^0)$ is the examination of the $0^{th}$ possible root). The evaluation by hinge path 300 at the first iteration uses a sequence of coefficients associated with the first iteration: $(\Lambda_t, \Lambda_{t-1}, \ldots, \Lambda_1, \Lambda_0)$. Referring back to FIG. 1, the sequence of coefficients associated with the first iteration may be passed from key equation solver 108 to parallel Chien search block 110 (i.e., hinge path 300 is not responsible for generating the sequence of coefficients for the first iteration). Hinge path 300 is one example of a component which performs step 200 in FIG. 2.

At the first iteration, positive limb paths 302 test whether the $1^{st}$-$8^{th}$ possible roots (i.e., $\alpha^1, \ldots, \alpha^8$) are roots of the error location polynomial using the sequence of coefficients associated with the first iteration (i.e., $(\Lambda_t, \Lambda_{t-1}, \ldots, \Lambda_1, \Lambda_0)$). Positive limb paths 302 show various examples of components which perform step 202 in FIG. 2.

The sequence of coefficients is passed to sequence reverser 304 which reverses the sequence input to it. For example, at the first iteration, the sequence $(\Lambda_t, \Lambda_{t-1}, \ldots, \Lambda_1, \Lambda_0)$ becomes $(\Lambda_0, \Lambda_1, \ldots, \Lambda_{t-1}, \Lambda_t)$. Sequence reverser 304 is one example of a component which performs step 204 in FIG. 2.

The reversed sequence of coefficients associated is passed from sequence reverser 304 to negative limb paths 306. At the first iteration, the reversed sequence of coefficients associated with the first iteration (i.e., $(\Lambda_t, \Lambda_{t-1}, \ldots, \Lambda_1, \Lambda_0)$) is used by negative limb paths 306 to test whether the $(-7)^{th}$-$(-1)^{st}$ possible roots (i.e., $\alpha^{-7}, \ldots, \alpha^{-1}$) are roots of the error location polynomial. Negative limb paths 306 show various examples of components which perform step 206 in FIG. 2.

Hinge path 300 updates the sequence of coefficients associated with the first iteration (i.e., $(\Lambda_t, \Lambda_{t-1}, \ldots, \Lambda_1, \Lambda_0)$) to obtain a sequence of coefficients associated with a second iteration (i.e., $(\Lambda_t', \Lambda_{t-1}', \ldots, \Lambda_1', \Lambda_0')$). At the second iteration, positive limb paths 302, sequence reverser 304, and negative limb paths 306 operate the same as described above, except they test different possible roots and use the updated (reversed) sequence of coefficients. That is, negative limb paths 306 and positive limb paths 302 test the $9^{th}$-$15^{th}$ possible roots and the $17^{th}$-$24^{th}$ possible roots, respectively, using the reversed sequence of coefficients associated with the second iteration (i.e., $(\Lambda_0', \Lambda_1', \ldots, \Lambda_{t-1}', \Lambda_t')$) and the sequence of coefficients associated with the second iteration (i.e., $(\Lambda_t', \Lambda_{t-1}', \ldots, \Lambda_1', \Lambda_0')$), respectively.

This process continues until all possible roots of the error location polynomial have been tested.

It is noted that the highest order limb path shown is this figure is an $8^{th}$ order limb path (i.e., limb path 8). In at least some parallel Chien search architectures, higher order limb paths correspond to more logic, which is undesirable. As such, the example 16-parallel Chien search block with folding shown herein may be more attractive compared to some other 16-parallel Chien search block. For example, compared to a 16-parallel Chien search block which has a single hinge path and $1^{st}$-$15^{th}$ order limb paths, this 16-parallel Chien search block with folding may use less logic because even though the number of limb paths is the same, the order of the limb paths is lower.

Note that parallel Chien search with folding works with different types of parallel Chien search architectures; the technique is not limited to any particular type of parallel Chien search architecture. In other words, hinge path 300 and/or limb paths 302 and 306 may be implemented using a variety of techniques.

Figure 3B:
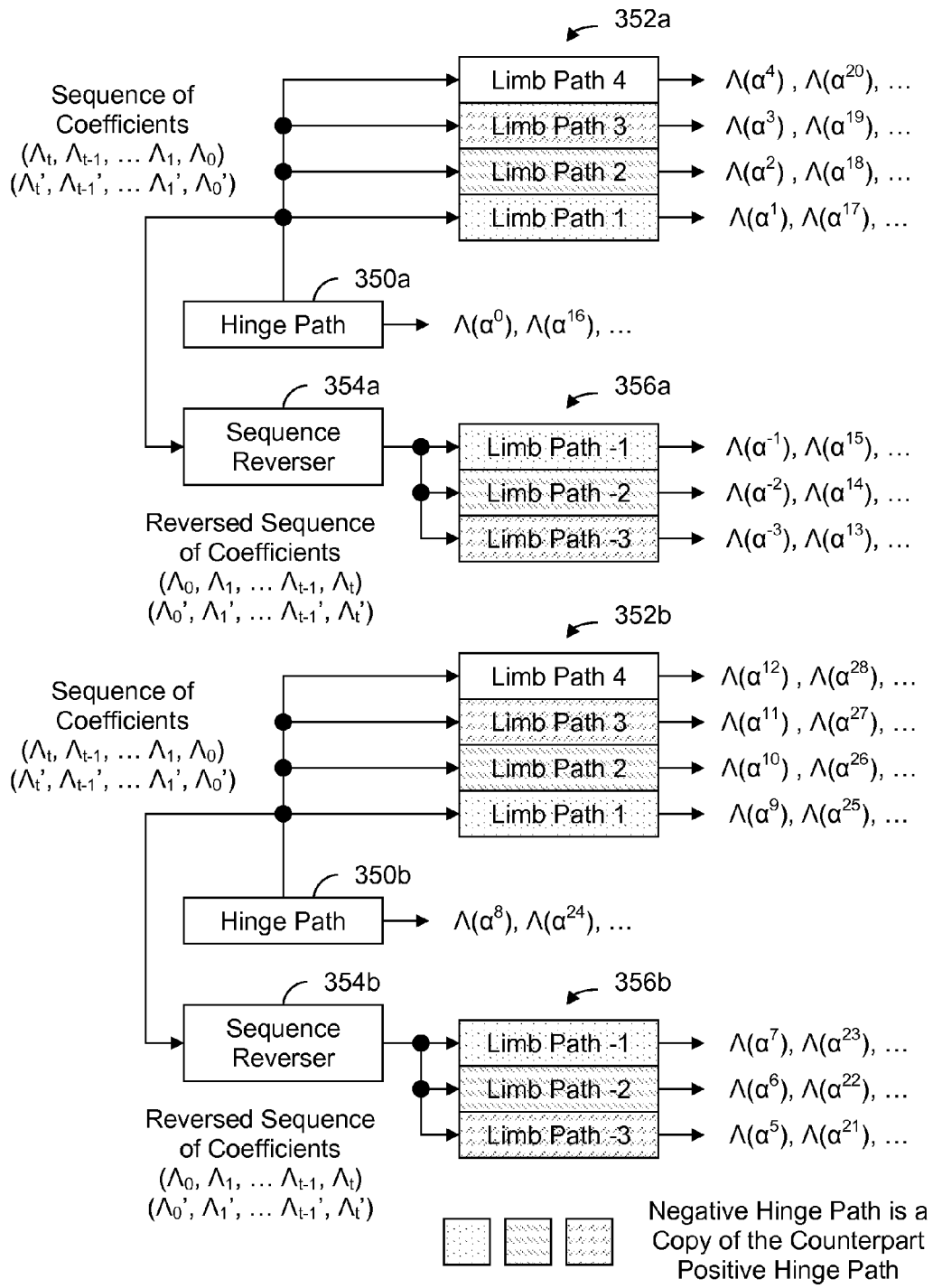
FIG. 3B shows an embodiment of a 16-parallel Chien search block with folding with two hinge paths.

FIG. 3B shows an embodiment of a 16-parallel Chien search block with folding with two hinge paths. FIG. 3B is similar to FIG. 3A, except FIG. 3B has two hinge paths and FIG. 3A has a single hinge path. Hinge paths 350a and 350b, positive limb paths 352a and 352b, sequence reversers 354a and 354b, and negative limb paths 356a and 356b operate the same as described in FIG. 3A.

In some applications, the number of hinge paths used in a parallel Chien search block with folding is selected based on a cost function. For example, a cost may be calculated which depends upon the number of hinge paths, the number of limb paths, and the order of the limb paths. Depending upon the degree of parallelism desired (e.g., 16-parallel, 32-parallel, 64-parallel, etc.) and the underlying costs (e.g., of a single hinge path, of a single limb path of a given order, etc.), a number of hinge paths which minimizes the cost function may be determined.

The following figures describe S-MPCN. In the examples described below, information is shared amongst paths which permits logic to be reused and reduces the total amount of logic in the system compared to some other parallel Chien search architectures.

S-MPCN

In general, the examination of the $i^{th}$ possible root $\alpha^i$ is:

$$\Lambda(\alpha^i) = \sum_{j=1}^{t} \Lambda_j \alpha^{ij} + 1$$

In S-MPCN, minimal polynomials are used to divide $\Lambda(x)$ directly. More formally:

$$\Lambda(\alpha^i) = \sum_{j=1}^{t} \Lambda_j \alpha^{ij} + 1 =$$

$$\sum_{j=1}^{t} \Lambda_j x^j \bigg|_{x=\alpha^i} + 1 = M_i(x) \times Q_i(x) + B_i(x)|_{x=\alpha^i} + 1 = B_i(\alpha^i) + 1,$$

where $B_i(x) = B_{i,m-1} x^{m-1} + \ldots + B_{i,1} x + B_{i,0}$ is the remainder polynomial and $B_{i,j} \in GF(2^m)$. Let $\{B_{i,m-1}, \ldots, B_{i,1}, B_{i,0}\} = \{b_{i,m^2-1}, \ldots, b_{i,1}, b_{i,0}\}$, where $b_{i,j} \in GF(2)$. Note that dividing $\Lambda(x)$ directly by the minimal polynomial(s) permits or results in the substitution of at least some Constant Finite Field Multiplier (CFFM)-implemented parallel paths with S-MPCN-implemented paths in S-MPCN compared to some other parallel Chien search techniques.

The evaluation of the remainder polynomial at the $i^{th}$ possible root (i.e., $B_i(\alpha^i)$) becomes:

$$\begin{bmatrix} \alpha_0^0 & \alpha_0^1 & \cdots & \alpha_0^{m-1} & \alpha_0^i & \alpha_0^{i+1} & \cdots & \alpha_0^{i+m-1} & \cdots & \cdots & \alpha_0^{i(m-1)} & \alpha_0^{i(m-1)+1} & \cdots & \alpha_0^{(i+1)(m-1)} \\ \alpha_1^0 & \alpha_1^1 & \cdots & \alpha_1^{m-1} & \alpha_1^i & \alpha_1^{i+1} & \cdots & \alpha_1^{i+m-1} & \cdots & \cdots & \alpha_1^{i(m-1)} & \alpha_1^{i(m-1)+1} & \cdots & \alpha_1^{(i+1)(m-1)} \\ \vdots & \vdots & \ddots & \vdots & \vdots & \vdots & \ddots & \vdots & \cdots & \cdots & \vdots & \vdots & \ddots & \vdots \\ \alpha_{m-1}^0 & \alpha_{m-1}^1 & \cdots & \alpha_{m-1}^{m-1} & \alpha_{m-1}^i & \alpha_{m-1}^{i+1} & \cdots & \alpha_{m-1}^{i+m-1} & \cdots & \cdots & \alpha_{m-1}^{i(m-1)} & \alpha_{m-1}^{i(m-1)+1} & \cdots & \alpha_{m-1}^{(i+1)(m-1)} \end{bmatrix}$$

$$\begin{bmatrix} b_{i,0} \\ b_{i,1} \\ \vdots \\ b_{i,m^2-1} \end{bmatrix}$$

A block which performs this operation (i.e., evaluating the remainder polynomial) is referred to as an $i^{th}$ symbolized basis transformer (S-BT i).

To obtain $B_i(x)$ efficiently, consider $x^j \mod M_i(x)$. If $M_i(x)$ is used as the primitive polynomial, then the m-tuple representation becomes:

$$x^j \mod M_i(x) = \alpha_{m-1,(i)}^j x^{m-1} + \ldots + \alpha_{1,(i)}^j x + \alpha_{0,(i)}^j$$

The remainder polynomial $B_i(x)$ can be constructed based on $x^j \mod M_i(x)$:

$$B_i(x) = B_{i,m-1} x^{m-1} + \ldots + B_{i,1} x + B_{i,0}$$

$$= \sum_{j=1}^{t} \Lambda_j x^j \mod M_i(x) = \sum_{j=1}^{t} \Lambda_j (x^j \mod M_i(x))$$

$$= \sum_{j=1}^{t} (\Lambda_j \alpha_{m-1,(i)}^j x^{m-1} + \ldots + \Lambda_j \alpha_{1,(i)}^j x + \Lambda_j \alpha_{0,(i)}^j)$$

Therefore, the examination of the $i^{th}$ possible root becomes:

$$\Lambda(\alpha^i) = M_i(x) \times Q_i(x) + B_i(x)|_{x=\alpha^i} + 1 = B_i(\alpha^i) + 1$$

$$= \sum_{j=1}^{t} (\Lambda_j \alpha_{m-1,(i)}^j x^{m-1} + \ldots + \Lambda_j \alpha_{1,(i)}^j x + \Lambda_j \alpha_{0,(i)}^j) \bigg|_{x=\alpha^i} + 1$$

Note that the equation for $\Lambda(\alpha^i)$ contains within it the equation for $B_i(x)$.

For examinations of possible roots which are conjugates, it is possible to share logic since they have the same minimal polynomial. For example, the examination of the $2i^{th}$ possible root is:

$$\Lambda(\alpha^{2i}) = B_{2i}(\alpha^{2i}) + 1$$

$$= \sum_{j=1}^{t} \Lambda_j (x^j \mod M_{2i}(x)) \bigg|_{x=\alpha^{2i}} + 1 = \sum_{j=1}^{t} \Lambda_j (x^j \mod M_i(x)) \bigg|_{x=\alpha^{2i}} + 1$$

$$= \sum_{j=1}^{t} (\Lambda_j \alpha_{m-1,(i)}^j x^{m-1} + \ldots + \Lambda_j \alpha_{1,(i)}^j x +$$

$$\Lambda_j \alpha_{0,(i)}^j) \bigg|_{x=\alpha^{2i}} + 1 = B_i(\alpha^{2i}) + 1$$

FIG. 4 is a diagram showing an embodiment of a remainder polynomial which is common to two possible roots which are conjugates. In the example shown, equation 400 shows the examination of a first possible root (i.e., $\alpha^i$) and equation 410 shows the examination of a second possible root (i.e., $\alpha^{2i}$). Note that the two possible roots which are being examined in equations 400 and 410 are conjugates of each other. A more detailed description of conjugate possible roots is provided below.

Looking closely at equations 400 and 410, the summations within equations 400 and 410 are the same (when the evaluation of the summations at $x=\alpha^i$ versus at $x=\alpha^{2i}$ is not taken into consideration). For example, the summations are both over $j=1, \ldots, t$ and the terms being summed are both $$(\Lambda_j \alpha_{m-1,(i)}^j x^{m-1} + \ldots + \Lambda_j \alpha_{1,(i)}^j x + \Lambda_j \alpha_{0,(i)}^j).$$

Referring back to the remainder polynomial $B_i(x)$ above, it is noted that the summation in equations 400 and 410 is merely the remainder polynomial $B_i(x)$.

The shared remainder polynomial in equations 400 and 410 means that the logic used to generate the remainder polynomial can be shared between the parallel paths associated with the examination of the $i^{th}$ possible root (i.e., $\Lambda(\alpha^i)$) and the examination of the $2i^{th}$ possible root (i.e., $\Lambda(\alpha^{2i})$). As shown in equations 400 and 410, this shared piece of logic which generates the remainder polynomial is referred to as an $i^{th}$ S-MPCN block.

The evaluation of the remainder polynomial is where equations 400 and 410 differ. In equation 400, the remainder polynomial is evaluated at $x=\alpha^i$ and in equation 410, the remainder polynomial is evaluated at $x=\alpha^{2i}$. As such, a first block (i.e., an $i^{th}$ S-BT block) is used to evaluate the remainder polynomial at $x=\alpha^i$ and a second block (i.e., a $2i^{th}$ S-BT block) is used to evaluate the remainder polynomial at $x=\alpha^{2i}$.

Table 420 shows possible roots which are conjugates and therefore which can share logic (specifically, share an S-MPCN block). Generally speaking, conjugate roots fall within the set $\{\alpha^i, \alpha^{2i}, \alpha^{4i}, \alpha^{8i}, \ldots, \alpha^{2^k i}\}$ where k may be 0, 1, 2, and so on. Note that i may be a negative value. Each row shows possible roots which are conjugates and thus which can share S-MPCN logic. In the first row, i=1 and the set of conjugate roots is $\{\alpha^1, \alpha^2, \alpha^4, \alpha^8, \ldots\}$. In the second row, i=3 and the set of conjugate roots is $\{\alpha^3, \alpha^6, \alpha^{12}, \alpha^{24}, \ldots\}$. Note that although i could be set to 2, the row where i=1 already includes $\alpha^2$. As such, i=2 is not shown in table 420 since a S-MPCN 2 block would be redundant since a S-MPCN 1 block already generates a remainder polynomial which can be used for $\alpha^2$.

Continuing on, the third row in table 420 shows the set of conjugate roots which result when i=5 and the fourth row in table 420 shows the set of conjugate roots which result when i=7. Rows for i=4 and i=6 are not included in table 420 because $\alpha^4$ is already included in the first row (where i=1) and $\alpha^6$ is already included in the second row (where i=3). Therefore, including an S-MPCN 4 block and/or an S-MPCN 6 block is unnecessary and/or redundant.

Figure 5:
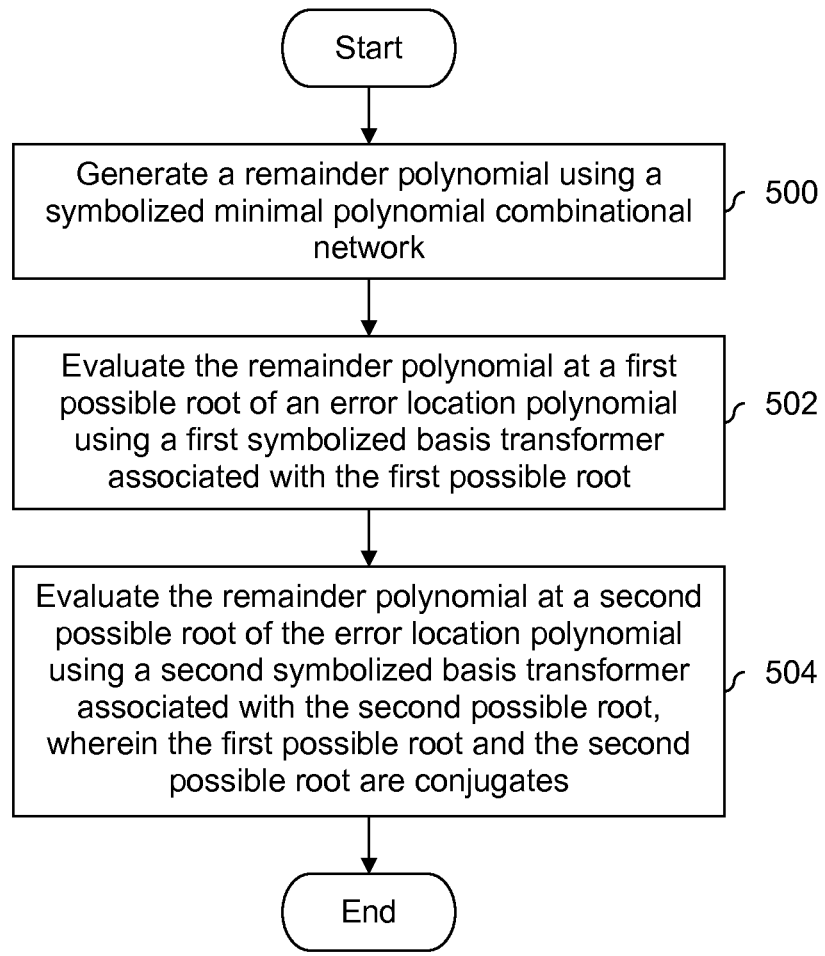
FIG. 5 is a flowchart illustrating an embodiment of performing a parallel Chien search using a shared S-MPCN block.

FIG. 5 is a flowchart illustrating an embodiment of performing a parallel Chien search using a shared S-MPCN block. In some embodiments, parallel Chien search block 110 in FIG. 1 performs the example process shown.

At 500, a remainder polynomial is generated using a symbolized minimal polynomial combinational network. For example, in equations 400 and 410 in FIG. 4, an $i^{th}$ shared S-MPCN block does this.

At 502, the remainder polynomial is evaluated at a first possible root of an error location polynomial using a first symbolized basis transformer associated with the first possible root. In equation 400 in FIG. 4, for example, $\alpha^i$ is one example of a first possible root. In the example of equation 400, an $i^{th}$ S-BT block evaluates the remainder polynomial generated by S-MPCN i for $x=\alpha^i$.

At 504, the remainder polynomial is evaluated at a second possible root of the error location polynomial using a second symbolized basis transformer associated with the second possible root, wherein the first possible root and the second possible root are conjugates. In equation 410 in FIG. 4, for example, $\alpha^{2i}$ is one example of a second root. In the example of equation 410, a $2i^{th}$ S-BT block evaluates the remainder polynomial generated by S-MPCN i for $x=\alpha^{2i}$. Note that $\alpha^i$ and $\alpha^{2i}$ are conjugates which satisfies the requirement that the first possible root and the second possible root be conjugates.

Figure 6:
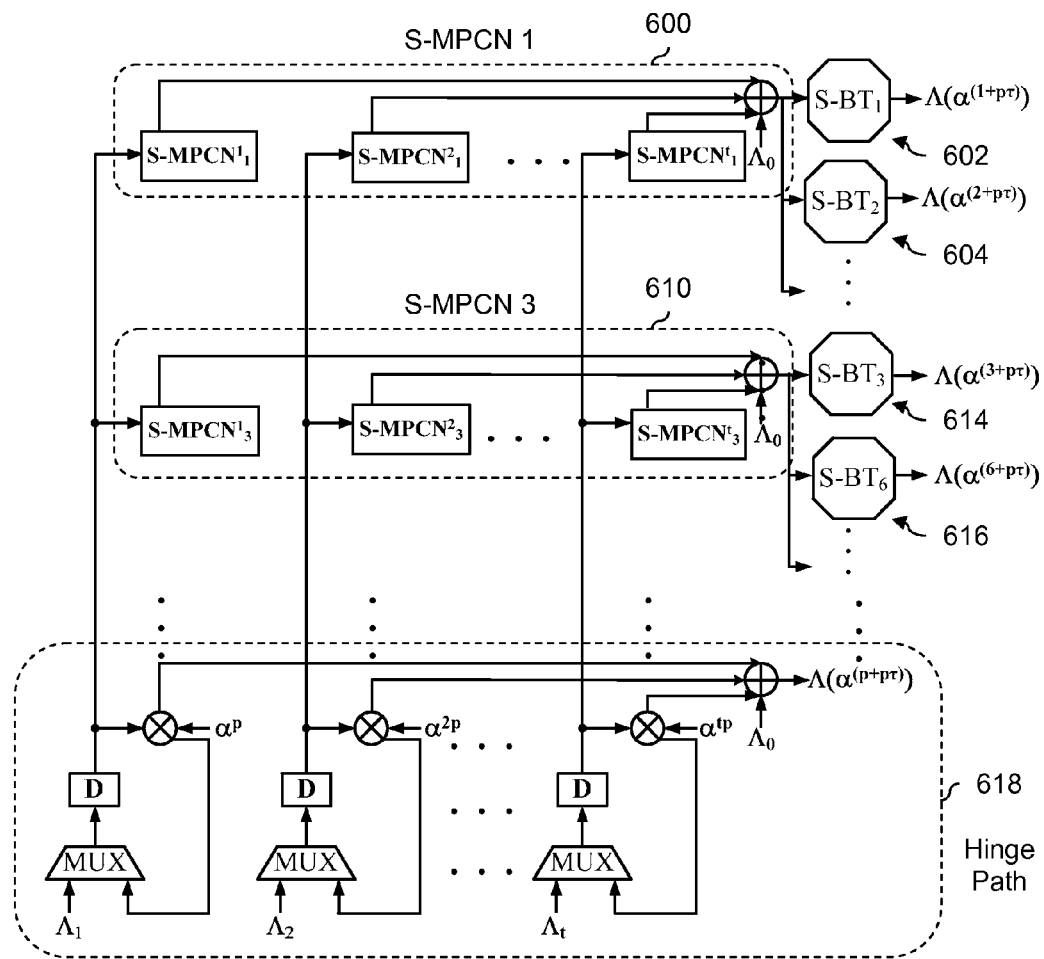
FIG. 6 is a diagram illustrating an embodiment of a parallel Chien search block which includes shared S-MPCN blocks.

FIG. 6 is a diagram illustrating an embodiment of a parallel Chien search block which includes shared S-MPCN blocks. In some embodiments, parallel Chien search block 110 in FIG. 1 is implemented as shown.

In one example of logic which performs the process of FIG. 5, step 500 in FIG. 5 is performed by S-MPCN 1 (600). S-MPCN 1 (600) generates a remainder polynomial (not shown) which is passed to S-BT 1 (602) and S-BT 2 (604). In this example, the first possible root is $\alpha^1$ and the second possible root is $\alpha^2$. S-BT 1 (602) evaluates the remainder polynomial at $x=\alpha^1$ (i.e., performing step 502 in FIG. 5) and S-BT 2 (604) evaluates the remainder polynomial at $x=\alpha^2$ (i.e., performing step 504 in FIG. 5).

Similarly, S-MPCN 3 (610), S-BT 3 (614), and S-BT 6 (616) show another example of logic which performs the process of FIG. 5. In that example, S-MPCN 3 (610) performs step 500 in FIG. 5, S-BT 3 (614) performs step 502 in FIG. 5, and S-BT 6 (616) performs step 504 in FIG. 5.

Logic 618 shows an example of a hinge path (e.g., hinge path 300 in FIG. 3A and/or hinge path 350a or 350b in FIG. 3B).

FIG. 7 is a table showing an embodiment of related conjugate roots $\alpha^1$-$\alpha^{32}$. In table 700, each row corresponds to a group of conjugate roots which share an S-MPCN block to generate a remainder polynomial which is common to all of them (in some figures herein, the S-MPCN block is shown as grouped in one parallel path, and the produced remainder polynomial is passed to other parallel paths). As indicated in FIG. 7, as the magnitude of i increases, the cost (e.g., in terms of size or the amount of logic) of a given S-MPCN block increases. For example, the size of the $31^{st}$ S-MPCN block (i.e., corresponding to the last row where i=31) is larger than the size of the $1^{st}$ S-MPCN block (i.e., corresponding to the first row where i=1). For this reason, combining parallel Chien search with folding and S-MPCN is attractive because parallel Chien search with folding effectively reduces the largest magnitude of i which is used. In some cases, although the number of S-MPCN blocks may remain substantially the same, the overall amount of logic used may be smaller when parallel Chien search with folding is used in combination with S-MPCN because the S-MPCN blocks used are smaller. The following figures show some examples of parallel Chien search with folding and S-MPCN.

Parallel Chien Search with Folding and S-MPCN

Figure 8:
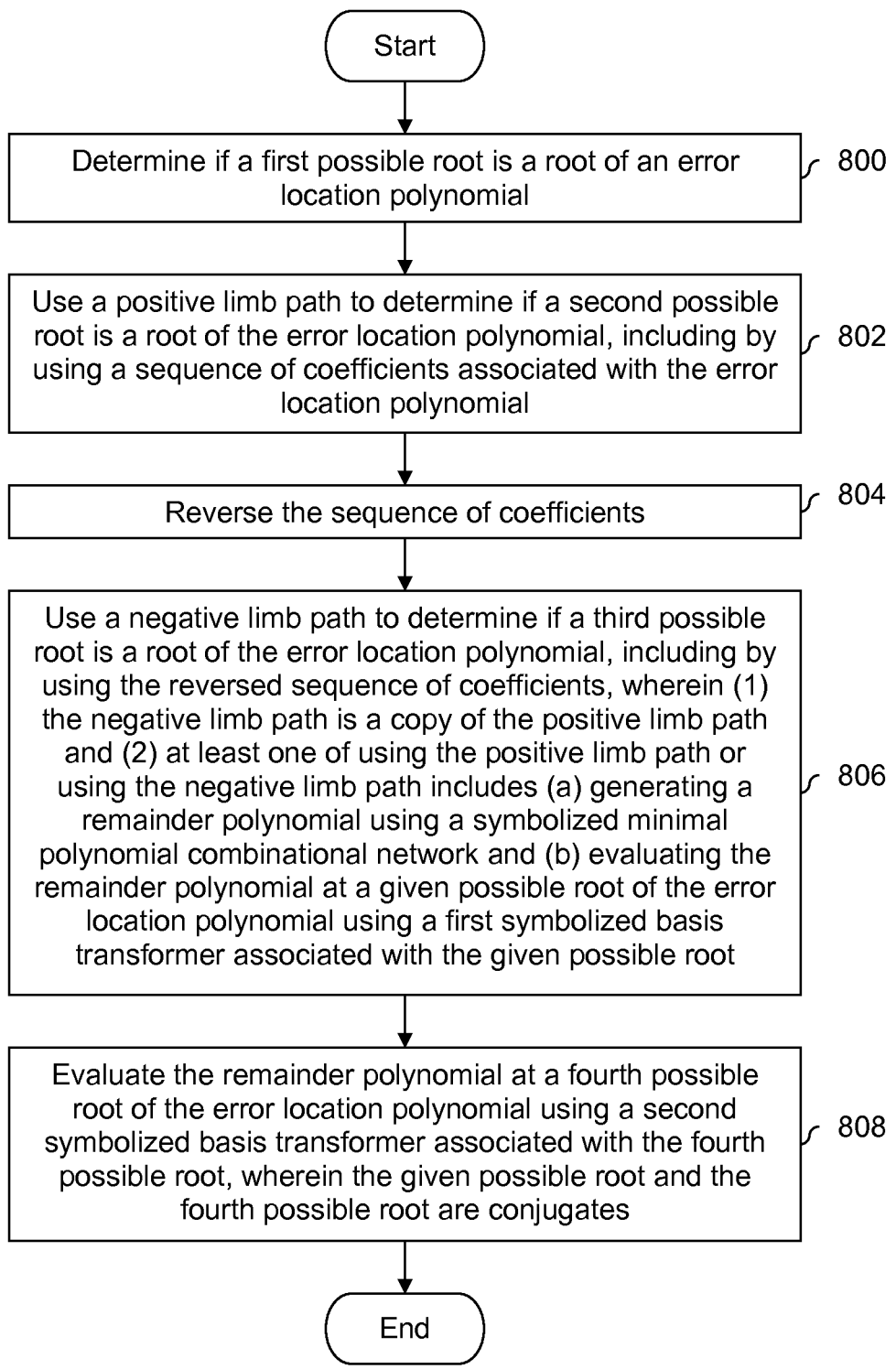
FIG. 8 is a flowchart illustrating an embodiment of parallel Chien search with folding and S-MPCN.

FIG. 8 is a flowchart illustrating an embodiment of parallel Chien search with folding and S-MPCN. In some embodiments, the process is performed by parallel Chien search block 110 in FIG. 1.

At 800, it is determined if a first possible root is a root of an error location polynomial. At 802, a positive limb path is used to determine if a second possible root is a root of the error location polynomial, including by using a sequence of coefficients associated with the error location polynomial. At 804, the sequence of coefficients is reversed. Note that steps 800, 802, and 804 are similar to steps 200, 202, and 204 shown in FIG. 2.

At 806, a negative limb path is used to determine if a third possible root is a root of the error location polynomial, including by using the reversed sequence of coefficients. The negative limb path is a copy of the positive limb path and at least one of using the positive limb path or using the negative limb path includes: (a) generating a remainder polynomial using a S-MPCN and (b) evaluating the remainder polynomial at a given possible root of the error location polynomial using a first S-BT associated with the given possible root. It is noted that either a positive limb path or a negative limb path can satisfy the limitation associated with generating a remainder polynomial using an S-MPCN and evaluating the remainder polynomial using an S-BT.

At 808, the remainder polynomial is evaluated at a fourth possible root of the error location polynomial using a second S-BT associated with the fourth possible root, wherein the given possible root and the fourth possible root are conjugates. For example, FIG. 7 shows some example related conjugate roots. In some embodiments, if step 806 is performed by a positive (negative) limb path then step 808 is also performed by a positive (negative) limb path. Note that step 808 is applicable when two or more S-BT blocks share a given S-MPCN block. If the remainder polynomial output by a given S-MPCN block is used by only one S-BT block, then step 808 is skipped.

The following figure shows an example of a system which performs the process of FIG. 8.

Figure 9:
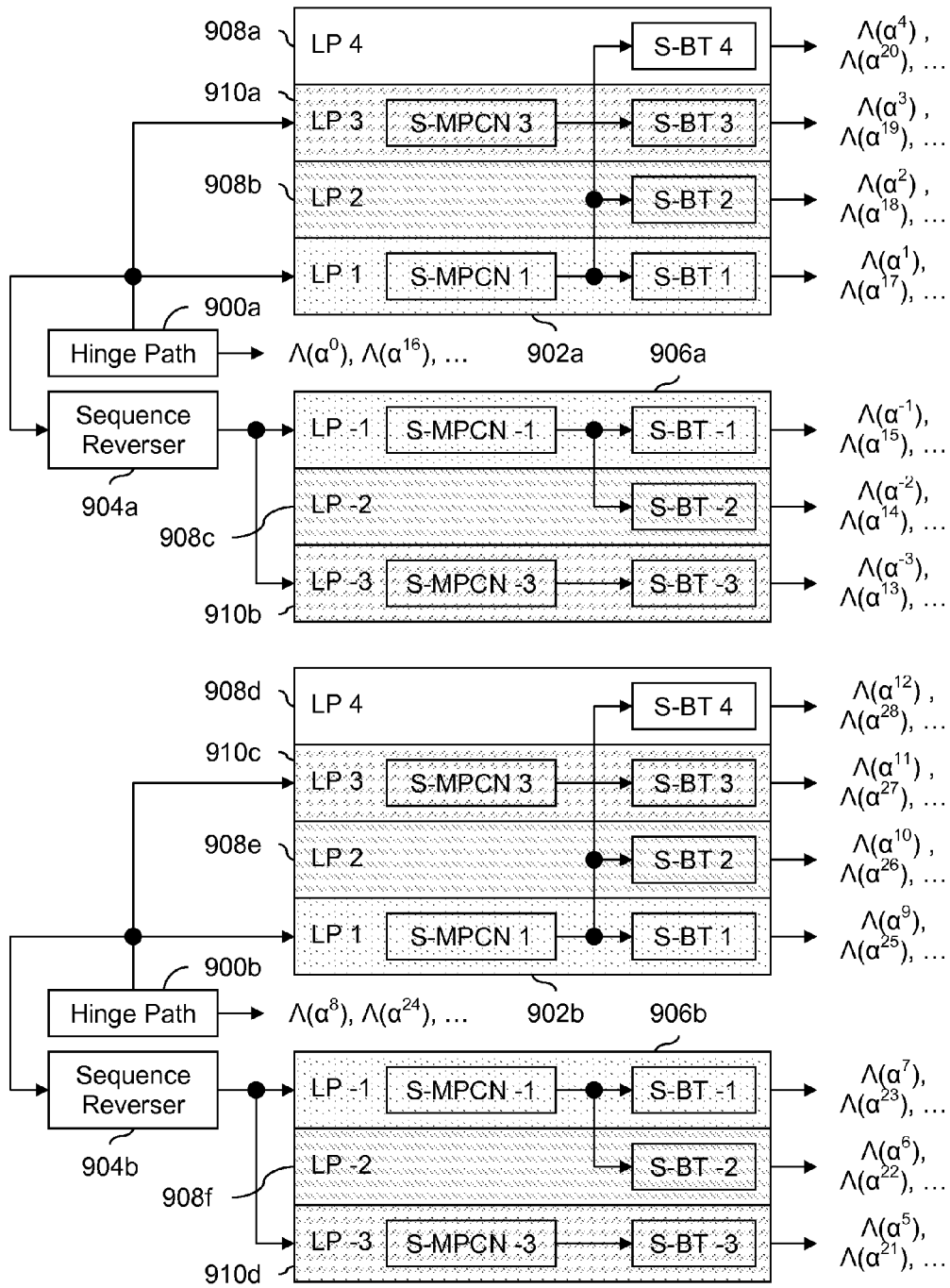
FIG. 9 shows an embodiment of a 16-parallel Chien search block with folding and S-MPCN.

FIG. 9 shows an embodiment of a 16-parallel Chien search block with folding and S-MPCN. In the example shown, at a first iteration, hinge paths 900a and 900b evaluate whether a $0^{th}$ possible root and an $8^{th}$ possible root, respectively, are roots of the error location polynomial. Hinge paths 900a and 900b show two examples of components which perform step 800 in FIG. 8.

Positive limb paths 902a and 902b evaluate at the first iteration whether a $1^{st}$ possible root and a $9^{th}$ possible root, respectively, are roots of the error location polynomial. Note that both receive as inputs the sequence of coefficients associated with the error location polynomial and use that sequence in their processing. Positive limb paths 902a and 902b are two examples of components which perform step 802 in FIG. 8.

Sequence reversers 904a and 904b reverse the sequence of coefficients and show two examples of components which perform step 804 in FIG. 8.

Negative limb paths 906a and 906b evaluate at the first iteration whether a $(-1)^{st}$ possible root and a $7^{th}$ possible root, respectively, are roots of the error location polynomial. Note that both use the reversed sequence of coefficients associated with the error location polynomial in their processing. Negative limb paths 906a and 906b are two examples of components which perform step 806 in FIG. 8.

Step 806 in FIG. 8 also recites the limitation that at least one of using the positive limb path or using the negative limb path includes (a) generating a remainder polynomial using an S-MPCN and (b) evaluating the remainder polynomial at a given possible root of the error location polynomial using a first S-BT associated with the given possible root. Positive limb paths 902a and 902b and negative limb paths 906a and 906b show examples of components which satisfy this. Note, for example, that positive limb paths 902a and 902b and negative limb paths 906a and 906b each include an S-MPCN for generating a remainder polynomial, as well as an S-BT for evaluating the remainder polynomial at the particular possible root.

Limb paths 908a-908f input remainder polynomials from shared S-MPCN blocks (e.g., the S-MPCN block in positive limb path 902a is shared amongst positive limb paths 902a, 908a, and 908b). At the first iteration, limb paths 908a-908f evaluate whether a $4^{th}$, $2^{nd}$, $(-2)^{nd}$, $12^{th}$, $10^{th}$, and $6^{th}$ possible root, respectively, are roots of the error location polynomial. Limb paths 908a-908f show various examples of components which perform step 808 in FIG. 8.

It is noted that the (reversed) sequence of coefficients are only passed to limb paths which include an S-MPCN. Limb paths which only include an S-BT use the results from a shared S-MPCN, so it is not necessary to pass the (reversed) sequence of coefficients to limb paths which only include an S-BT.

The 16-parallel Chien search block shown in FIG. 9 offers some improvements over that shown in FIG. 3B. Specifically, the 16-parallel Chien search block in FIG. 9 shares S-MPCN blocks, which is not necessarily the case in FIG. 3B (e.g., each limb path in FIG. 3B could have its own S-MPCN block, which is inefficient). By sharing S-MPCN blocks, the amount of logic consumed may be reduced.

Obviously, the more paths a given S-MPCN block is shared amongst, the greater the savings in logic. Looking at FIG. 9, it is noted that some of the S-MPCN are only used by a single limb path, or a single S-BT block. For example, the remainder polynomials generated by limb paths 910a-910d are only used by the S-BT blocks therein. To put it another way, the S-MPCN blocks in limb paths 910a-910d are not shared. The following figure shows an example where limb paths with unshared S-MPCN blocks are replaced by limb paths which require less logic.

Parallel Chien Search with Folding and S-MPCN (No Unshared S-MPCN)

Figure 10:
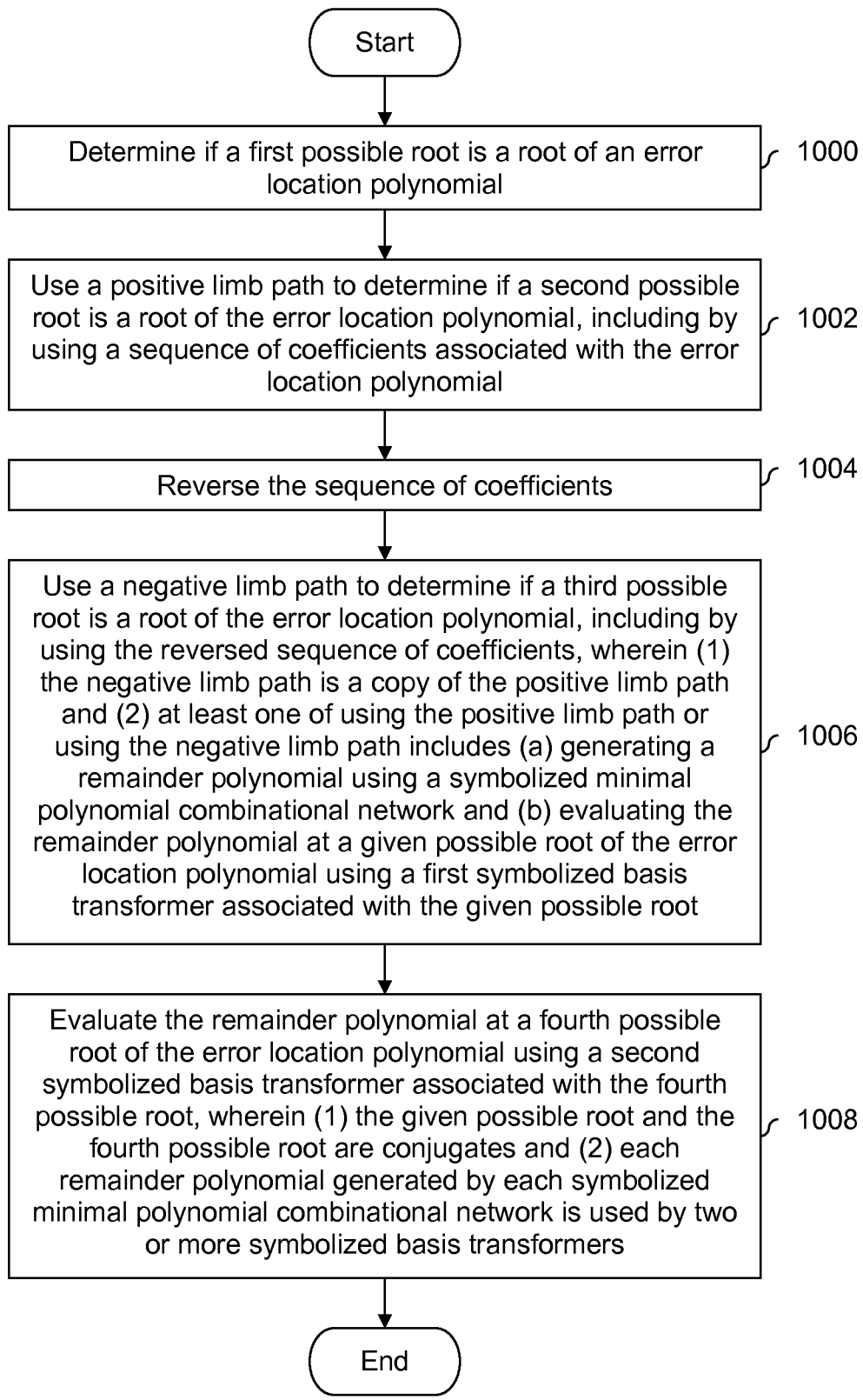
FIG. 10 is a flowchart illustrating an embodiment of a process for performing parallel Chien search with folding and S-MPCN where there are no unshared S-MPCN blocks.

FIG. 10 is a flowchart illustrating an embodiment of a process for performing parallel Chien search with folding and S-MPCN where there are no unshared S-MPCN blocks.

In some embodiments, parallel Chien search block 110 in FIG. 1 performs the process shown.

At 1000, it is determined if a first possible root is a root of an error location polynomial. At 1002, a positive limb path is used to determine if a second possible root is a root of the error location polynomial, including by using a sequence of coefficients associated with the error location polynomial. At 1004, the sequence of coefficients is reversed. At 1006, a negative limb path is used to determine if a third possible root is a root of the error location polynomial, including by using the reversed sequence of coefficients, wherein (1) the negative limb path is a copy of the positive limb path and (2) at least one of using the positive limb path or using the negative limb path includes (a) generating a remainder polynomial using a symbolized minimal polynomial combinational network and (b) evaluating the remainder polynomial at a given possible root of the error location polynomial using a first symbolized basis transformer associated with the given possible root. At 1008, the remainder polynomial is evaluated at a fourth possible root of the error location polynomial using a second symbolized basis transformer associated with the fourth possible root, wherein (1) the given possible root and the fourth possible root are conjugates and (2) each remainder polynomial generated by each symbolized minimal polynomial combinational network is used by two or more symbolized basis transformers. As described above, step 1008 is applicable when two or more S-BT blocks share a S-MPCN block and is skipped when only a single S-BT block uses the remainder polynomial out by a S-MPCN block.

The following figure shows an example system which performs the process of FIG. 10.

Figure 11:
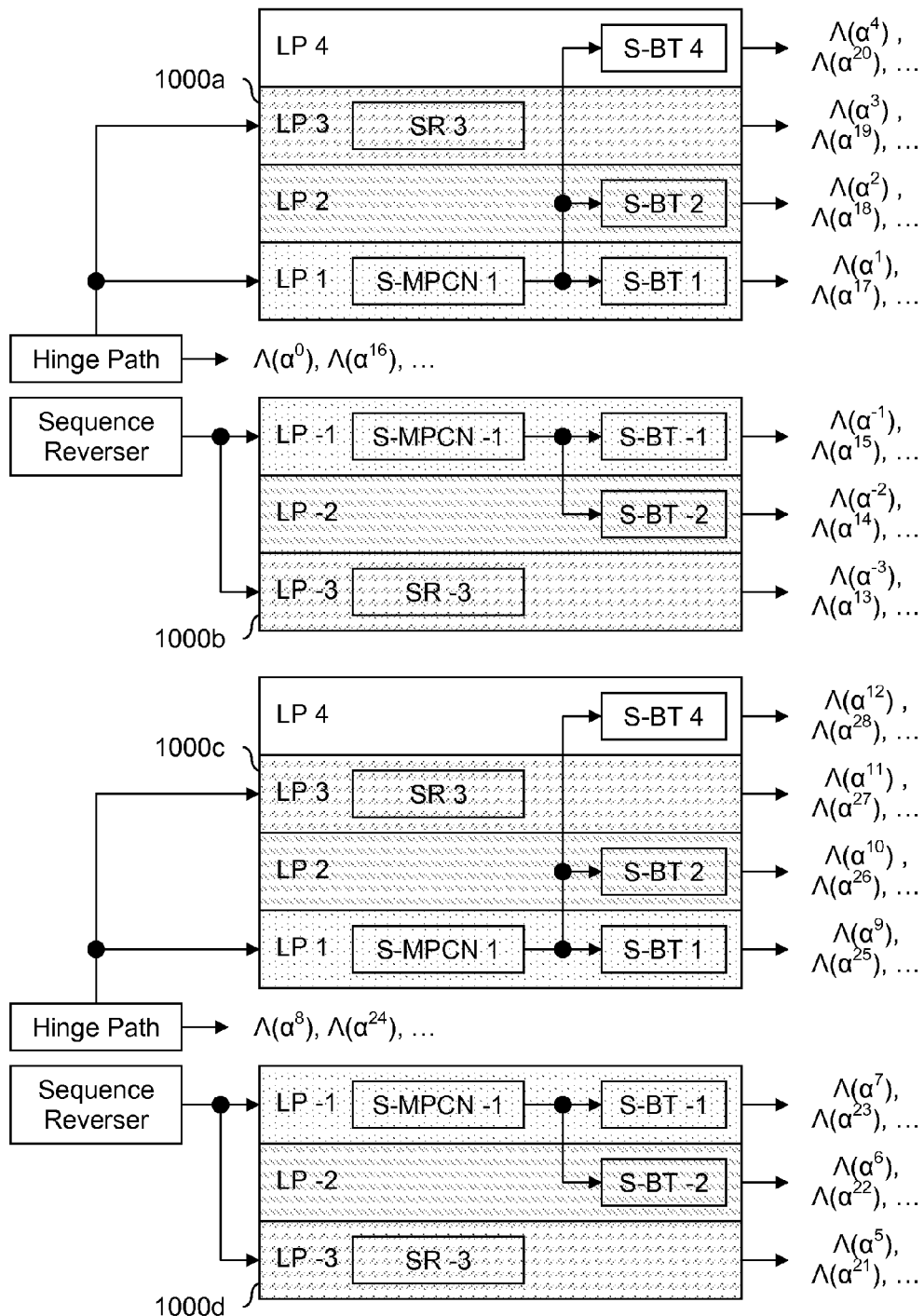
FIG. 11 is a diagram illustrating an embodiment of a system which performs parallel Chien search with folding and S-MPCN where there are no unshared S-MPCN blocks.

FIG. 11 is a diagram illustrating an embodiment of a system which performs parallel Chien search with folding and S-MPCN where there are no unshared S-MPCN blocks. In the example shown, limb paths 1000a-1000d are implemented using a strength reduced parallel path, which requires less logic than a similar path which includes an S-MPCN block and a S-BT block. In some applications, the system shown in FIG. 11 uses less logic than the figure shown in FIG. 9 and (as such) is more attractive (assuming there are no other tradeoffs).

Although FIG. 11 shows negative limb paths 1000b and 1000d as inputting the reversed sequence of coefficients, naturally in some embodiments those negative limb paths input the non-reversed sequence of coefficients. For example, some replacement negative limb paths may expect the non-reversed sequence of coefficients and the appropriate sequence is provided.

Note that a strength reduced parallel path is merely an exemplary replacement parallel path. Any parallel path architecture may be used, preferably so long as less logic is used. It is not necessary for all replacements paths to be the same type. For example, one type of replacement may be the best option for positive limb path 1000a, but a different type of replacement may be the best option for negative limb path 1000b. In some embodiments, there may be a crossover point where replacement makes sense. For example, as described above, as the magnitude of i associated with an S-MPCN block increases, the cost increases. There may be an alternative parallel Chien search architecture for which for smaller magnitudes of i it does not make sense to swap out the S-MPCN block and S-BT block. However, for larger magnitudes of i it may make sense to make the substitution. These factors and other factors may be taken into consideration when selecting a replacement limb path.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for decoding data by performing a parallel Chien search, comprising:
   a syndrome calculator configured to receive encoded data and to generate one or more syndromes using the encoded data;
   a key equation solver configured to generate an error location polynomial from the syndromes; and
   a parallel Chien search block configured to locate a number of roots and output decoded data when the number of roots equals a degree of the error location polynomial, the parallel Chien search block including:
   a hinge path configured to determine whether a first root is a root of the error location polynomial;
   a positive limb path configured to determine whether a second root is a root of the error location polynomial based on a sequence of coefficients associated with the error location polynomial;
   a sequence reverser configured to reverse the sequence of coefficients;
   a negative limb path configured to determine whether a third root is a root of the error location polynomial based on the reversed sequence of coefficients,
   a symbolized minimal polynomial combinational network configured to generate remainder polynomials;
   a first symbolized basis transformer configured to evaluate a first remainder polynomial generated by the symbolized minimal polynomial combinational network; and
   a second symbolized basis transformer configured to evaluate a second remainder polynomial generated by the symbolized minimal polynomial combinational network,
   wherein the symbolized minimal polynomial combinational network is shared by the first symbolized basis transformer and the second symbolized basis transformer.

2. The system of claim 1, wherein the syndrome calculator is configured to generate the syndromes using BCH encoded data.

3. The system of claim 2, further comprising solid state storage, wherein the BCH encoded data is stored on the solid state storage.

4. The system of claim 1, wherein the system is configured to determine decoding of the block is successful when a number of roots located equals a degree of the error location polynomial.

5. A system for decoding data by performing a parallel Chien search, comprising:
   a syndrome calculator configured to receive encoded data and to generate one or more syndromes using the encoded data;
   a key equation solver configured to generate an error location polynomial from the syndromes; and
   a parallel Chien search block configured to locate a number of roots and output decoded data when the number of roots equals a degree of the error location polynomial, the parallel Chien search block including:
   a symbolized minimal polynomial combinational network configured to generate remainder polynomials;

a first symbolized basis transformer, associated with a first root of the error location polynomial, which is configured to evaluate a first remainder polynomial generated by the symbolized minimal polynomial combinational network at the first root of the error location polynomial; and a second symbolized basis transformer, associated with a second root of the error location polynomial, which is configured to evaluate a second remainder polynomial generated by the symbolized minimal polynomial combinational network at the second root of the error location polynomial, wherein the first root and the second root are conjugates, wherein the symbolized minimal polynomial combinational network is shared by the first symbolized basis transformer and the second symbolized basis transformer.

6. The system of claim 5, wherein hinge paths use the error location polynomial to determine partial multiplication terms.

7. The system of claim 5, wherein the syndrome calculator is configured to generate the syndromes using BCH encoded data.

8. The system of claim 7, further comprising solid state storage, wherein the BCH encoded data is stored on the solid state storage.

9. A method for decoding data by performing a parallel Chien search, comprising:

receiving, with a syndrome calculator, encoded data;

generating, with the syndrome calculator, one or more syndromes using the encoded data;

generating, with a key equation solver, an error location polynomial from the generated syndromes;

determining, with a hinge path whether a first root is a root of the error location polynomial;

determining, with a positive limb path, whether a second root is a root of the error location polynomial based on a sequence of coefficients associated with the error location polynomial;

reversing, with a sequence reverser, the sequence of coefficients;

determining, with a negative limb path, whether a third root is a root of the error location polynomial based on the reversed sequence of coefficients, wherein the negative limb path is a copy of the positive limb path, generating, with a symbolized minimal polynomial combinational network, remainder polynomials, evaluating, with a first symbolized basis transformer, a first remainder polynomial generated by the symbolized minimal polynomial combinational network, evaluating, with a second symbolized basis transformer, a second remainder polynomial generated by the symbolized minimal polynomial combinational network, the symbolized minimal polynomial combinational network being shared by the first and second symbolized basis transformer, and outputting decoded data when a number of roots equals a degree of the error location polynomial.

10. The method of claim 9, wherein generating the syndromes includes using BCH encoded data.

11. The method of claim 10, wherein the BCH encoded data is stored on solid state storage.

12. A method for decoding data by performing a parallel Chien search, comprising:

receiving, with a syndrome calculator, encoded data;

generating, with the syndrome calculator, one or more syndromes using the encoded data;

generating, with a key equation solver, an error location polynomial from the generated syndromes;

generating, with a symbolized minimal polynomial combinational network, remainder polynomials;

evaluating, with a first symbolized basis transformer associated with a first root of the error location polynomial, a first remainder polynomial generated by the symbolized minimal polynomial combinational network at the first root of the error location polynomial; and evaluating, with a second symbolized basis transformer associated with a second root of the error location polynomial, a second remainder polynomial generated by the symbolized minimal polynomial combinational network at the second root of the error location polynomial, wherein the first root and the second root are conjugates, and outputting decoded data when a number of roots equals a degree of the error location polynomial;

wherein the symbolized minimal polynomial combinational network is shared by the first symbolized basis transformer and the second symbolized basis transformer.

13. The method of claim 12, further comprising:

generating the error location polynomial using the syndromes, wherein hinge paths use the error location polynomial to determine partial multiplication terms.

14. The method of claim 13, wherein generating the syndromes includes using BCH encoded data.

15. The method of claim 14, wherein the BCH encoded data is stored on solid state storage.

* * * * *